United States Patent
Ohta et al.

(10) Patent No.: US 8,288,936 B2
(45) Date of Patent: Oct. 16, 2012

(54) LIGHT EMITTING APPARATUS, METHOD FOR MANUFACTURING THE LIGHT EMITTING APPARATUS, ELECTRONIC DEVICE AND CELL PHONE DEVICE

(75) Inventors: Masayuki Ohta, Mihara (JP); Masahiro Konishi, Ikoma (JP); Yasuji Takenaka, Higashihiroshima (JP)

(73) Assignee: Sharp Kabushiki Kaisha, Osaka-shi (JP)

(*) Notice: Subject to any disclaimer, the term of this patent is extended or adjusted under 35 U.S.C. 154(b) by 102 days.

(21) Appl. No.: 12/134,047

(22) Filed: Jun. 5, 2008

(65) Prior Publication Data

US 2008/0303411 A1 Dec. 11, 2008

(30) Foreign Application Priority Data

Jun. 5, 2007 (JP) ................................ 2007-149815
Nov. 28, 2007 (JP) ................................ 2007-308065

(51) Int. Cl.
*H05B 33/14* (2006.01)
(52) U.S. Cl. .................... 313/503; 313/506; 313/512
(58) Field of Classification Search .................... 257/40, 257/72, 98–100, 642–643, 759; 313/498–512, 313/110–117; 315/169.1, 169.3; 427/58, 427/64, 66, 532–535, 539; 428/690–691, 428/917; 438/26–29, 34, 82; 445/24–25
See application file for complete search history.

(56) References Cited

U.S. PATENT DOCUMENTS

| | | | | |
|---|---|---|---|---|
| 6,670,648 B2 * | 12/2003 | Isokawa et al. | ................ | 257/99 |
| 6,960,878 B2 * | 11/2005 | Sakano et al. | ................ | 313/512 |
| 7,063,996 B2 * | 6/2006 | Ishii et al. | ................ | 438/28 |
| 7,342,357 B2 * | 3/2008 | Sakano et al. | ................ | 313/512 |
| 2002/0190637 A1 * | 12/2002 | Matsubara et al. | ........... | 313/503 |
| 2004/0046178 A1 * | 3/2004 | Sano | ................ | 257/98 |
| 2005/0247944 A1 * | 11/2005 | Haque et al. | ................ | 257/79 |
| 2005/0253158 A1 * | 11/2005 | Yasukawa et al. | ................ | 257/98 |
| 2006/0138937 A1 * | 6/2006 | Ibbetson | ................ | 313/502 |
| 2006/0186431 A1 * | 8/2006 | Miki et al. | ................ | 257/100 |
| 2007/0102722 A1 * | 5/2007 | Ishizaka et al. | ................ | 257/99 |
| 2007/0205425 A1 * | 9/2007 | Harada | ................ | 257/98 |
| 2007/0262335 A1 * | 11/2007 | Kumei et al. | ................ | 257/98 |
| 2007/0269915 A1 * | 11/2007 | Leong et al. | ................ | 438/28 |
| 2008/0049446 A1 * | 2/2008 | Harbers et al. | ................ | 362/612 |

(Continued)

FOREIGN PATENT DOCUMENTS

JP 2001-77433 3/2001

(Continued)

OTHER PUBLICATIONS

Japanese Office Action mailed Jan. 17, 2012, directed to Japanese Application No. 2007-308065; 3 pages.

(Continued)

*Primary Examiner* — Mariceli Santiago
*Assistant Examiner* — Donald Raleigh
(74) *Attorney, Agent, or Firm* — Morrison & Foerster LLP

(57) ABSTRACT

A light emitting apparatus is provided, and the light emitting apparatus has a light emitting device mounted on a substrate or a resin package where a substrate surface or the resin package is resin-encapsulated by an encapsulating resin section added with a phosphor in such a manner to cover the light emitting device. A surface resin layer of a different color from that of the encapsulating resin section is provided on a surface side of the encapsulating resin section.

16 Claims, 11 Drawing Sheets

U.S. PATENT DOCUMENTS

2008/0074032 A1 3/2008 Yano et al.

FOREIGN PATENT DOCUMENTS

| | | |
|---|---|---|
| JP | 2001-135861 | 5/2001 |
| JP | 2004-221163 | 8/2004 |
| JP | 2007-81090 | 3/2007 |
| JP | 2007-126536 | 5/2007 |
| JP | 2007-129226 | 5/2007 |
| WO | WO-03/021691 | 3/2003 |
| WO | WO-2005/104247 | 11/2005 |

OTHER PUBLICATIONS

Chinese Office Action dated Nov. 27, 2009, directed to counterpart Chinese Application No. 200810108247; 14 pages.

Office Action dated May 16, 2012, directed to Japanese Application No. 2007-308065; 3 pages.

* cited by examiner

FIG.7
(a) 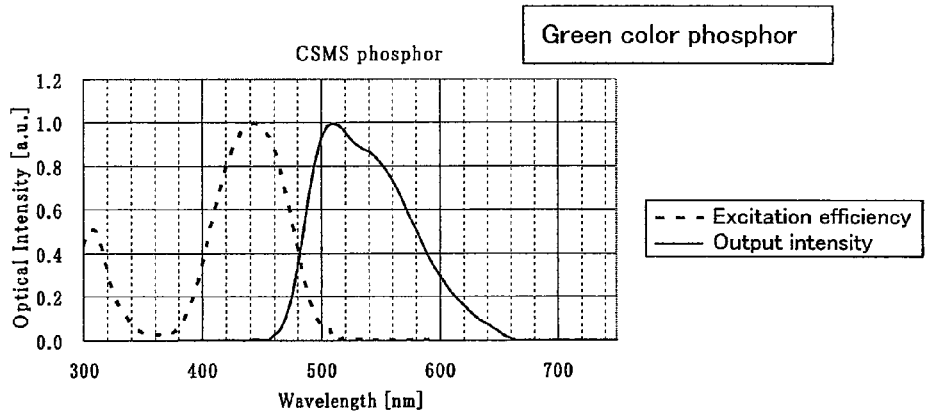
(b) 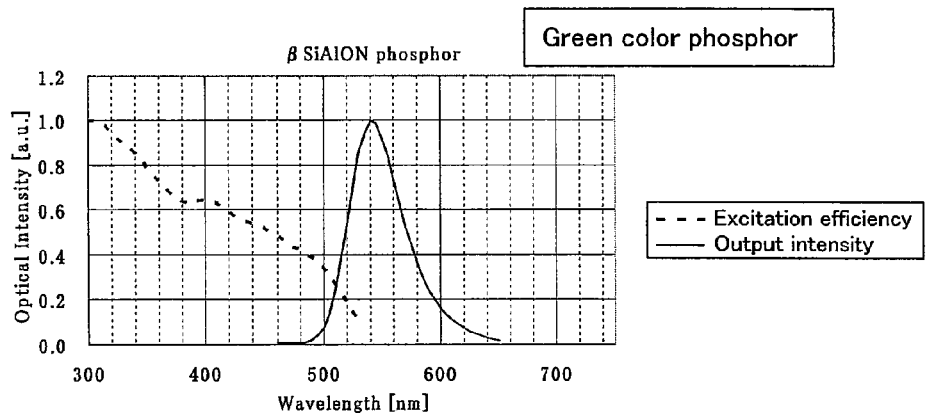
(c) 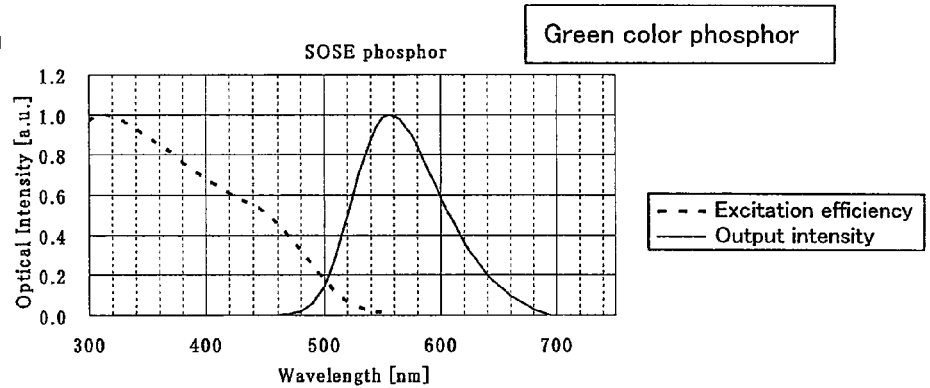
(d) 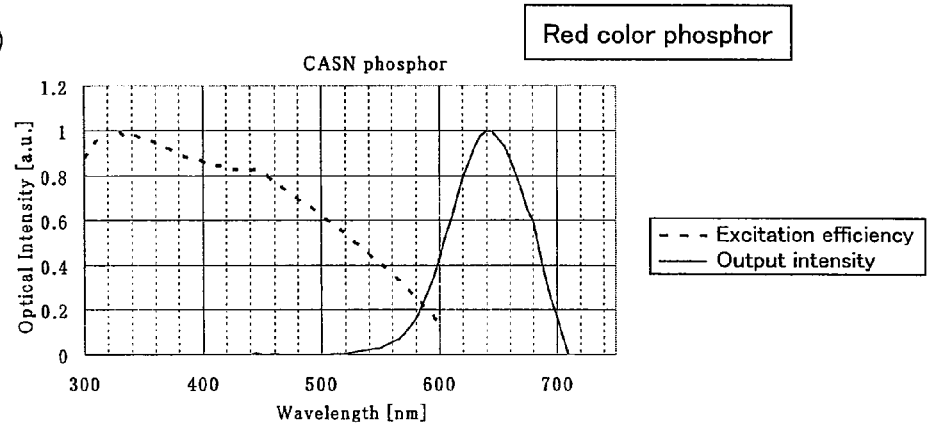

ially flat. In addition, the side surfaces of the light
LIGHT EMITTING APPARATUS, METHOD FOR MANUFACTURING THE LIGHT EMITTING APPARATUS, ELECTRONIC DEVICE AND CELL PHONE DEVICE This Nonprovisional application claims priority under 35 U.S.C. §119(a) on Patent Application No. 2007-149815 filed in Japan on Jun. 5, 2007, the entire contents of which are hereby incorporated by reference.

BACKGROUND OF THE INVENTION

1. Field of the Invention

The present invention relates to a light emitting apparatus equipped with a light emitting device, such as an LED, and resin-encapsulated thereon; a method for manufacturing the light emitting apparatus; an electronic device equipped with the light emitting apparatus as camera lighting therein, such as a digital camera (e.g., digital video camera and digital still camera), a door intercom camera, a camera for television telephone, and a camera equipped in a cell phone; and a cell phone device with the camera equipped in a cell phone.

2. Description of the Related Art

LEDs have been conventionally used as a flash for camera lighting of a cell phone device, and References 1 and 2, for example, disclose light emitting apparatuses equipped with such LEDs as light emitting devices. One example is shown in FIG. 8.

Hereinafter, a conventional light emitting apparatus and a cell phone device using the light emitting apparatus as a flash for camera lighting will be described in detail with reference to FIG. 8.

FIG. 8(a) is a perspective view showing an exemplary diagrammatic structure of a conventional cell phone device; FIG. 8(b) is a perspective view showing an exemplary essential structure of a light emitting apparatus equipped in the flash light section in FIG. 8(a); and FIG. 8(c) is an elevation view of the flash light section in FIG. 8(a).

As shown in FIG. 8(a), a conventional cell phone device 20 is equipped with a camera, and a flash light section 22 for camera lighting is provided adjacent to a camera lens section 21.

A light emitting apparatus 220 as shown in FIG. 8(b) is built in the flash light section 22 for camera lighting. The light emitting apparatus 220 is equipped with a blue color LED chip 222, which has a main emission peak in a blue color wavelength region of 400-530 nm, as a light emitting device on a light emitting substrate 221. The overall surface of the substrate is resin-encapsulated in such a manner to cover the LED chip 222. The surface of this encapsulating resin section 223 is parallel to the surface of the substrate 221 and the surface is almost flat. In addition, the side surfaces of the light emitting apparatus 220 are plane surfaces which are formed in such a manner to cut off both the encapsulating resin section 223 and the substrate 221 perpendicular to the substrate 221. Further, the encapsulating resin section 223 includes a phosphor for performing a wavelength conversion on light from the LED chip 222. The phosphor is included in order to obtain a white color emission without using red, green and blue color LEDs of three primary colors, but the blue color LED only.

A yellow color phosphor with a good light emitting efficiency, such as a BOSE (europium activated silicate phosphor, $(Ba.Sr)_2SiO_4:Eu$), is often used as a phosphor included in the encapsulating resin section 223 because the light emitting apparatus 220 for camera lighting needs light emitting luminance at or above a certain level. The yellow color phosphor absorbs a blue light radiated from the blue color LED chip 222 and radiates a yellow color fluorescence having an emission peak in a wavelength region of 550-600 nm.

Reference 1: International Publication No. WO 2003/021691
Reference 2: Japanese Laid-Open Publication No. 2001-135861

SUMMARY OF THE INVENTION

The conventional technique described above, however, has the following problems.

As described above, because the conventional light emitting apparatus 220 for camera lighting needs luminance at or above a certain level, a yellow color phosphor with a good light emitting efficiency, such as BOSE (europium activated silicate phosphor, $(Ba.Sr)_2SiO_4:Eu$), is used as a phosphor included in the encapsulating resin section 223. In this case, the flash light section 22 looks yellow by the surrounding light when the light emitting device is not switched on. In some cases, this yellow may not match the casing of the cell phone device 20, spoiling the appearance. In particular, the yellow color is pronounced and therefore not preferable to Westerners. Therefore, a frosted-glass-like semitransparent cover 224 is provided for the surface side of the flash light section 22 for camera lighting in the cell phone device 20 as shown in FIG. 8(c) and FIG. 4(c), so that a yellow appearance of the encapsulating resin section 223 looks whitish. However, the semitransparent cover 224 is not preferable since the cover decreases the light emitting intensity of the LED.

The present invention solves the conventional problems described above. The objective of the present invention is to provide a light emitting apparatus, which includes a phosphor in the encapsulating resin section and is capable of emitting white light, maintaining the light emitting efficiency while not spoiling the appearance due to the coloring of the encapsulating resin section; a method for manufacturing the light emitting apparatus; and an electronic device and a cell phone device that are equipped with the light emitting apparatus for camera lighting.

A light emitting apparatus according to the present invention includes a light emitting device mounted on a substrate or a resin package where a substrate surface or the resin package is resin-encapsulated by an encapsulating resin section added with a phosphor in such a manner to cover the light emitting device, in which a surface resin layer of a different color from that of the encapsulating resin section is provided on a surface side of the encapsulating resin section, thereby achieving the objective described above.

Preferably, in a light emitting apparatus according to the present invention, the light emitting device is a blue color LED.

Still preferably, in a light emitting apparatus according to the present invention, the phosphor is a yellow color phosphor or a chromatic color phosphor. Herein, the chromatic color phosphor is a kind of phosphor that presents a color emitting a visible light ranging between blue and red by being excited by a light emitting device, where an encapsulating resin section including the chromatic color phosphor presents a color that includes a color (including not only colors close to primary colors but also whitish blue, for example) except black, gray and white.

Still preferably, in a light emitting apparatus according to the present invention, the phosphor is a BOSE (europium activated silicate phosphor, $(Ba.Sr)_2SiO_4:Eu$).

Still preferably, in a light emitting apparatus according to the present invention, the color of the encapsulating resin section added with a phosphor is yellow.

Still preferably, in a light emitting apparatus according to the present invention, an optical diffusion material is added to the surface resin layer.

Still preferably, in a light emitting apparatus according to the present invention, the optical diffusion material is capable of reflecting a visible light ranging between a blue color and a red color.

Still preferably, in a light emitting apparatus according to the present invention, the optical diffusion material is a particle of about 2 µm-5 µm in size.

Still preferably, in a light emitting apparatus according to the present invention, the optical diffusion layer is at least one of organic filler, fused silica and titanium oxide.

Still preferably, in a light emitting apparatus according to the present invention, the color of the surface resin layer is white.

Still preferably, in a light emitting apparatus according to the present invention, at least one of a red color phosphor, a green color phosphor and a blue color phosphor is added to the surface resin layer.

Still preferably, in a light emitting apparatus according to the present invention, the substrate is an insulating substrate.

Still preferably, in a light emitting apparatus according to the present invention, the color of the surface resin layer is one of a white color, a color ranging between green and red, or a whitish light color ranging between green and red.

Still preferably, in a light emitting apparatus according to the present invention, a surface of the substrate or a surface of a recess section of the resin package, on which the light emitting device is mounted, is a reflection face.

Still preferably, in a light emitting apparatus according to the present invention, the substrate is an AlN ceramic substrate or a resin substrate.

Still preferably, in a light emitting apparatus according to the present invention, the resin substrate is a glass epoxy substrate.

Still preferably, in a light emitting apparatus according to the present invention, the surface resin layer and the encapsulating resin section are made of a same resin material or different resin materials.

Still preferably, in a light emitting apparatus according to the present invention, a plurality of the light emitting devices and the encapsulating resin sections are provided on the substrate as light emitting modules; and the surface resin layer is provided on the plurality of the encapsulating resin sections.

Still preferably, in a light emitting apparatus according to the present invention, the encapsulating resin section is a translucent mold section, which is divided, from the side closer to the light emitting device, into a layer substantially including the phosphor and a layer substantially including an optical diffusion material as the surface resin layer.

Still preferably, in a light emitting apparatus according to the present invention, the encapsulating resin section is a translucent mold section, which is divided, from the side closer to the light emitting device, into a layer substantially including the phosphor, an intermediate layer including the phosphor and an optical diffusion material intermingled together and a layer substantially including the optical diffusion material as the surface resin layer.

Still preferably, in a light emitting apparatus according to the present invention, the encapsulating resin section is a translucent mold section, which is divided, from the side closer to the light emitting device, into a layer substantially including the phosphor, a layer including the phosphor and an optical diffusion material intermingled together, a layer substantially including the optical diffusion material as the surface resin layer, and a layer only with the encapsulating resin section.

Still preferably, in a light emitting apparatus according to the present invention, the phosphor and the optical diffusion material are selected to have specific gravities greater than the specific gravity of a resin material for an encapsulating resin section that includes the phosphor and the optical diffusion material.

Still preferably, in a light emitting apparatus according to the present invention, the phosphor is selected to have a specific gravity greater than the specific gravity of the optical diffusion material.

Still preferably, in a light emitting apparatus according to the present invention, the optical diffusion material is composed of inorganic fine particles.

Still preferably, in a light emitting apparatus according to the present invention, the optical diffusion material is any one of silicon dioxide, calcium carbonate, titanium oxide, zinc oxide, aluminum oxide, barium titanate, barium sulfate, magnesium hydroxide, calcium hydroxide, magnesium oxide, and the combination thereof.

Still preferably, in a light emitting apparatus according to the present invention, a material for the encapsulating resin section is any one of solventless liquid translucent thermosetting resin, solvent liquid translucent thermosetting resin, and solvent liquid translucent thermoplastic resin.

Still preferably, in a light emitting apparatus according to the present invention, the solventless liquid translucent thermosetting resin is any one of epoxy resin, silicone resin, urethane resin, unsaturated polyester resin, acrylic urethane resin, and polyimide resin.

Still preferably, in a light emitting apparatus according to the present invention, the solvent liquid translucent thermoplastic resin is any one of acrylic resin, polycarbonate resin, and polynorbornene resin.

An electronic device according to the present invention is equipped with a camera and the light emitting apparatus according to the present invention as camera lighting, thereby achieving the objective described above.

A cell phone device according to the present invention is equipped with a camera and the light emitting apparatus according to the present invention as camera lighting, thereby achieving the objective described above.

Preferably, in a cell phone device according to the present invention, a transparent cover is provided for a surface side of the light emitting apparatus.

A method for manufacturing a light emitting apparatus according to the present invention includes: an encapsulating resin section forming step of applying an encapsulating resin added with a phosphor on a substrate or a resin package equipped with a light emitting device, planarizing a surface of the encapsulating resin by pressing, and curing the encapsulating resin so as to form an encapsulating resin section on the substrate or the resin package in such a manner to cover the light emitting device; and a surface resin layer forming step of applying a resin material added with an optical diffusion material for the cured encapsulating resin section, planarizing the surface of the resin material by pressing, and curing the resin material so as to form a surface resin layer of a preferred color, which is different from a color of the encapsulating resin section, on the encapsulating resin section, thereby achieving the objective described above.

A method for manufacturing a light emitting apparatus according to the present invention includes: an encapsulating resin section forming step of applying an encapsulating resin added with a phosphor on a substrate or a resin package equipped with a light emitting device, planarizing a surface of the encapsulating resin by pressing, and curing the encapsulating resin so as to form an encapsulating resin section on the substrate or the resin package in such a manner to cover above the light emitting device; and a surface resin layer forming step of applying a resin material added with at least one of a red color phosphor, a green color phosphor and a blue color phosphor for the cured encapsulating resin section, planarizing a surface of the resin material by pressing, and curing the resin material so as to form a surface resin layer of a preferred color, which is different from the color of the encapsulating resin section, on the surface of the encapsulating resin section, thereby achieving the objective described above.

A method for manufacturing a light emitting apparatus according to the present invention having a light emitting device mounted on a substrate or a resin package where a substrate surface or the resin package is resin-encapsulated by an encapsulating resin section added with a phosphor in such a manner to cover the light emitting device, includes the steps of mixing an optical diffusion material and a phosphor, the phosphor having greater specific gravity than the optical diffusion material, in a resin material that is used for the encapsulating resin section in such a manner to disperse the optical diffusion material and the phosphor almost evenly; and precipitating the phosphor in the resin material to a light emitting device side by the decrease of resin viscosity caused at the heat curing of the resin material and by the difference of specific gravities between the optical diffusion material and the phosphor so as to distribute the optical diffusion material at the surface side of the resin material, which is opposite from the light emitting device side, thereby achieving the objective described above.

A method for manufacturing a light emitting apparatus according to the present invention having a light emitting device mounted on a substrate or a resin package where a substrate surface or the resin package is resin-encapsulated by an encapsulating resin section added with a phosphor in such a manner to cover the light emitting device includes the steps of: covering a light emitting device mounted on a substrate or a resin package with an encapsulating resin section added with a phosphor and curing the encapsulating resin section; pouring a resin material added with an optical diffusion material into a metal mold having a recess; inserting the light emitting device mounted on the substrate or the resin package into the resin material added with the optical diffusion material with the surface side of the cured encapsulating resin section added with the phosphor facing down; and precipitating the optical diffusion material due to the decrease of resin viscosity caused at the heat curing of the resin material added with the optical diffusion material and by the difference of specific gravities between the resin material and the optical diffusion material, thereby achieving the objective described above.

Still preferably, in a method for manufacturing a light emitting apparatus according to the present invention, a same resin material as the encapsulating resin section or a different material is used as a material for the surface resin layer.

Still preferably, in a method for manufacturing a light emitting apparatus according to the present invention, a blue color LED is used as the light emitting device.

Still preferably, in a method for manufacturing a light emitting apparatus according to the present invention, a yellow color phosphor is used as a phosphor for the encapsulating resin.

With the structures described above, the function of the present invention will be described.

In a case where the color of the appearance of the encapsulating resin section is not preferable due to the emphasis on the light emitting efficiency, the present invention enables the surface of the light emitting apparatus to present an appearance of a preferred color, which is different from the color of the encapsulating resin section, when the light emitting apparatus is not switched on by providing a surface resin layer, whose color is different from that of the encapsulating resin section, on the encapsulating resin section.

For example, a light emitting apparatus using a blue color LED as a light emitting device is added with a yellow color phosphor in the encapsulating resin section therein in order to efficiently obtain white light. The yellow phosphor radiates yellow color fluorescence having an emission peak in a wavelength region of 550-600 nm. When such a light emitting apparatus is used for a lighting section of a cell phone device equipped with a camera, there may be a case where the matching of the yellow color of the surface of the light emitting apparatus (appearance color of the encapsulating resin section) and the color of the casing of the cell phone device spoils the overall appearance.

In such a case, an optical diffusion material is added to the surface resin layer. Then, visible light of blue color to red color of all the surrounding light is reflected by the optical diffusion material when the light emitting device is not on, so that the surface resin layer looks white. As a result, the flash light section for camera lighting equipped with the light emitting apparatus looks white.

Alternatively, at least one of a red color phosphor, a green color phosphor and a blue color phosphor is added to the surface resin layer, so that a preferred color can be obtained in response to the surrounding light. For example, a red color phosphor is added in order to make the surface of the light emitting apparatus look red. A green color phosphor is added in order to make the surface of the light emitting apparatus look green. A blue color phosphor is added in order to make the surface of the light emitting apparatus look white. In addition, the compounding ratio of the red and green phosphors may be adjusted, so that the surface of the light emitting apparatus has a visible light color between the green color and the red color. By adding a blue color phosphor to this combination, the surface of the light emitting apparatus has a whitish visible light color between the green color and the red color.

An encapsulating resin that is added with a phosphor is applied for a surface of a substrate or a surface of a recess part of a resin package, the substrate and the resin package being equipped with a light emitting device. Subsequently, the surface is planarized by pressing and the encapsulating resin is cured, thereby forming the encapsulating resin section. In addition, the surface resin layer can be formed by applying a resin material, which is added with either an optical diffusion material or a phosphor of an aforementioned color, for a surface of the cured encapsulating resin section, planarizing the surface by pressing, and curing the resin material.

In addition, an optical diffusion material is distributed in a resin material on the surface side opposing a light emitting device by specific gravity, and therefore the optical diffusion material is dispersed in a resin material concentrating on the surface side of light emitting view plane, thereby diminishing a color of a phosphor, such as yellow, by the optical diffusion material.

According to the present invention with the structure described above, the surface of the light emitting apparatus can present an appearance of a preferred color and improve the appearance when the light emitting apparatus is not on, by providing a surface resin layer of the preferred color different from the encapsulating resin section on the surface of the encapsulating resin section.

Because an optical diffusion material is distributed in a resin material on the surface side opposing a light emitting device by specific gravity, the optical diffusion material is dispersed in a resin material concentrating on the surface side of light emitting view plane, thereby diminishing a color of a phosphor, such as yellow, by the optical diffusion material.

These and other advantages of the present invention will become apparent to those skilled in the art upon reading and understanding the following detailed description with reference to the accompanying figures.

BRIEF DESCRIPTION OF THE DRAWINGS

FIG. 7 is a diagram graphically showing an excitation wavelength characteristic of each colored phosphor.

Figure 1:
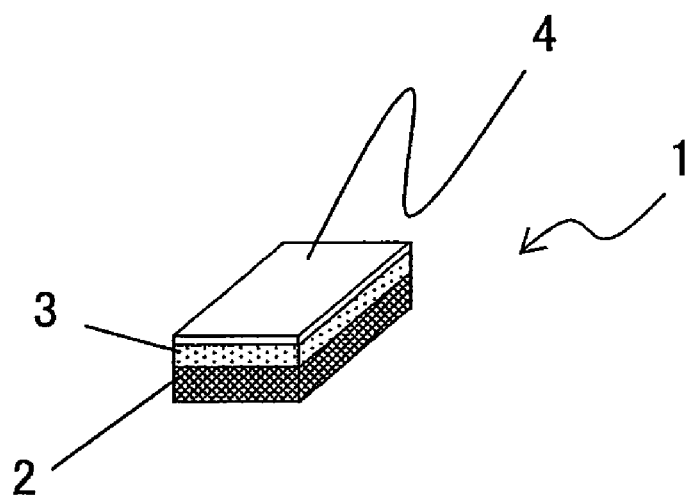
FIG. 1 is a perspective view showing an exemplary essential structure of the light emitting apparatus according to Embodiment 1 of the present invention.

1, 1A, 1B, 15-17 light emitting apparatus
2 substrate
2A resin package
3, 3A encapsulating resin section
3a encapsulating resin material
4, 4A, 40, 41-44 surface resin layer
4a resin material
5 wiring pattern
6, 6A LED chip
7 wire
8a, 8b external connecting electrode
9a, 9b penetrating conductive layer
10 cell phone device
11 camera lens section
12 flash light section
13 phosphor
14 optical diffusion material
18 metal mold
31, 33 spacer jig
32, 34 upper metal mold
121 LED mount substrate
122 wiring
123 transparent cover

DESCRIPTION OF THE PREFERRED EMBODIMENTS

Hereinafter, Embodiments 1 to 3 of a light emitting apparatus and a method for manufacturing the light emitting apparatus according to the present invention will be described in detail with reference to the attached figures, where the light emitting apparatus and the method for manufacturing the light emitting apparatus are applied for a flash light section of a camera mounted in a cell phone.

(Embodiment 1)

In Embodiment 1, a case will be described where a surface resin layer, in which a light diffusing material is added, is formed on a surface of an encapsulating resin to make the surface of the light emitting apparatus white.

Figure 2:
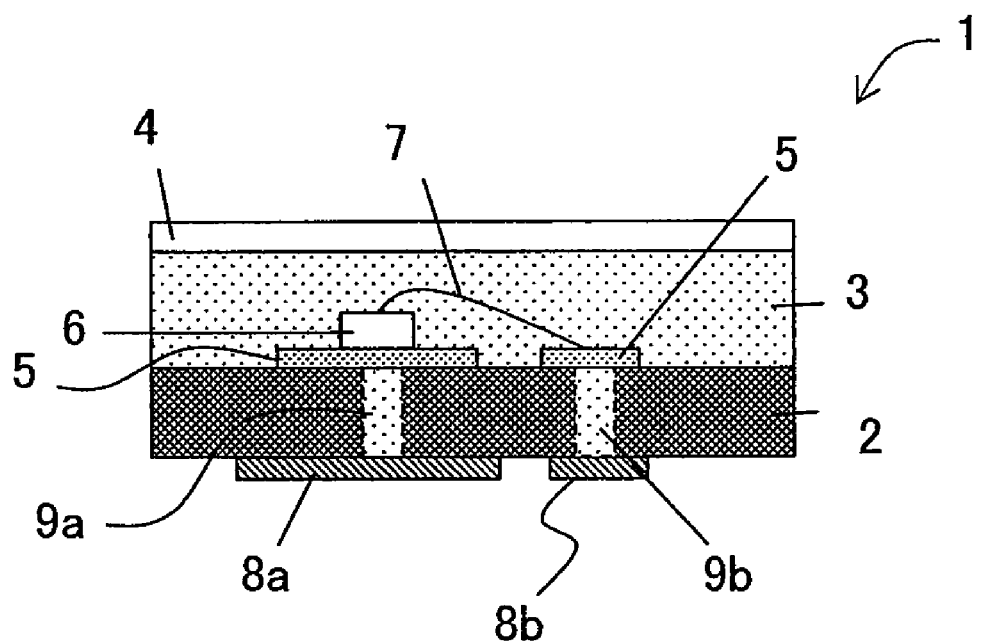
FIG. 2 is a longitudinal cross sectional view of the light emitting apparatus in FIG. 1.

FIG. 1 is a perspective view showing an exemplary essential structure of the light emitting apparatus according to Embodiment 1 of the present invention; and FIG. 2 is a longitudinal cross sectional view of the light emitting apparatus in FIG. 1.

As shown in FIGS. 1 and 2, the light emitting apparatus 1 of Embodiment 1 includes a blue color LED chip 6 equipped on a substrate 2, the blue color LED chip 6 functioning as a light emitting device which is connected to a wiring pattern 5 and having a main emission peak in a blue color wavelength region of 400-530 nm; an encapsulating resin section 3 encapsulating the blue color LED chip 6 to cover the blue color LED chip 6, the encapsulating resin section 3 being added with a phosphor which performs a wavelength conversion on a light from the blue color LED chip 6; and a surface resin layer 4 provided on a surface of the encapsulating resin section 3, the surface resin layer 4 being white which is different from the color of the exterior of the encapsulating resin section 3.

In Embodiment 1, an AlN ceramic substrate is used as the substrate 2, the AlN ceramic substrate having a high optical reflectivity to a visible light and having a thermal conductivity that is almost the same as metal. The thickness of the substrate 2 is set between 0.3-0.4 mm so as to facilitate cutting in a cutting step described later. Other insulating substrates, such as a resin substrate including a glass epoxy substrate, may be used in accordance with a required reliability and characteristic. Wiring patterns 5 are formed on a surface of the substrate 2; and the blue color LED chip 6 is equipped, being connected on one of the wiring patterns 5. In addition, an adjacent wiring pattern 5 and the blue color LED chip 6 are connected with each other by a wire 7. In addition, an external connecting electrode 8a is formed on the back side of the substrate 2, and the external connecting electrode 8a and the wiring pattern 5 under the LED chip 6 are electrically connected with each other through a conductive layer (penetrating conductive layer) 9a, the conductive layer 9a being provided to penetrate the substrate 2 in the depth direction. In addition, an external connecting electrode 8b is formed on the back side of the substrate 2, and the external connecting electrode 8b and another wiring pattern 5 are electrically connected with each other through a conductive layer (penetrating conductive layer) 9b, the conductive layer 9b being provided in such a manner to penetrate the substrate 2 in the depth direction.

The entire surface of the substrate is resin-encapsulated to cover the circumference of the LED chip 6. This encapsulating resin section 3 is added with a phosphor which changes the wavelength of the light from the blue color LED chip 6 to radiate a fluorescence. In Embodiment 1, a yellow color phosphor with a high light emitting efficiency, such as BOSE (europium activated silicate phosphor, $(Ba.Sr)_2SiO_4:Eu$), is used. The yellow color phosphor absorbs a blue light radiated from the blue color LED chip 6 and radiates a yellow color fluorescence having an emission peak in a wavelength region of 550-600 nm.

The surface of the encapsulating resin section 3 is parallel to the surface of the substrate 2 and is almost flat. The surface resin layer 4 is provided on the surface of the encapsulating resin section 3, and a light diffusing material is added to the surface resin layer 4. The light diffusing material is a particle of about 2-5 µm (or preferably 3-4 µm) in size, having a high optical reflectivity to a visible light. When the light diffusing material is applied to the surface resin layer 4, the visible lights in the range of a blue light to a red light are reflected among the surrounding light, thereby making the surface resin layer 4 look white. The surface resin layer 4 also has a function to reflect an emitted light when the light is on, and therefore it is necessary to adjust the thickness of the layer and the density of the light diffusing material under the respective predetermined values. The thickness and the density are adjusted as appropriate to balance with the appearance of the white color when the light is off. In Embodiment 1, the thickness of the surface resin layer 4 is set in the range of 20 to 50 µm. Organic filler, fused silica or titanium oxide ($TiO_2$) may be used for the light diffusing material, and organic filler is used in Embodiment 1 due to the advantage that the particle size is even. Further, the same resin material is used for both the surface resin layer 4 and the encapsulating resin section 3 in view of an influence at the interface, such as reflection due to adhesion by heat and a difference in the respective refractive indices. More specifically, the encapsulating resin section 3 is made of a silicon resin added with a phosphor, and the surface resin layer 4 is made of the same silicon resin used for the encapsulating resin section 3 added with a light diffusing material.

With respect to the side of the light emitting apparatus 1, the surface resin layer 4, the underlying encapsulating resin section 3, and the underlying substrate 2 are cut together, perpendicular to the surface of the substrate 2 to form a flat surface. Therefore, the shape of the light emitting apparatus 1 is a rectangular parallelepiped with a shallow depth and a large in-plane direction area. More specifically, the light emitting apparatus 1 is, for example, 0.7 mm in depth, 1.6 mm in width, and 2.0 mm in height.

In accordance to the structure described above, a method for manufacturing the light emitting apparatus 1 of Embodiment 1 will be described in detail hereinafter with reference to FIG. 2 and FIGS. 3(a)-3(j).

FIGS. 3(a)-3(j) are schematic perspective views to describe each manufacturing step of the light emitting apparatus 1 of Embodiment 1.

First, in FIG. 3(a), a substrate 2 is prepared, in which a wiring pattern 5 shown in FIG. 2 is formed on a surface side, and external connecting electrodes 8a and 8b are formed on a back side, and each wiring pattern 5 and external connecting electrodes 8a and 8b are electrically connected through penetrating conductive layers 9a and 9b. Herein, it is desirable that the penetrating section is not hollow. If it is hollow, moisture in the air will condense by the change in temperature, causing a malfunction such as deterioration of the penetrating conductive layers 9a and 9b. Although the wiring pattern 5 is designed as appropriate in accordance with the form of the electrode of the LED chip 6, a chip with a p-type electrode and an n-type electrode formed on the upper and lower surfaces of the chip is used as the LED chip 6 herein. Therefore, a LED chip mounting section and a wire bonding section are formed as a wiring pattern. The LED chip mounting section and the wire bonding section of the wiring pattern 5 are connected with the respective external connecting electrodes 8a and 8b on the corresponding anode side and cathode side through the penetrating conductive layers 9a and 9b described above. The LED chip 6 is die-bonded to the LED chip mounting section of the wiring pattern 5, and the upper electrode of the LED chip 6 and the wire bonding section are wired to the mounting section by a wire bond 7.

Next, in FIG. 3(b), the substrate 2 on which the LED chip 6 is mounted is placed on a press equipped with a heating plate so as to pour a fluid-state silicone resin 3a, to which a phosphor is added as an encapsulating resin section 3, on the substrate 2.

Further, in FIG. 3(c), a pair of spacer jigs is set such that the jigs are set in an opposed position, the spacer jigs forming a constant resin thickness around the substrate 2. Subsequently, as shown in FIG. 3(d), a flat upper metal mold 32 is pressed on the surface of the encapsulating resin 3a. The upper metal mold 32 becomes a cover for a metal mold vessel, having a function to planarize the surface of the encapsulating resin 3a.

Next, in FIG. 3(e), the encapsulating resin 3a is cured by heating to form an encapsulating resin section 3. Subsequently, as shown in FIG. 3(f), a fluid-state silicone resin 4a, to which a light diffusing material is added, is poured as a resin material on the surface of the encapsulating resin section 3.

Subsequently, in FIG. 3(g), the spacer jigs 31 are exchanged with spacer jigs 33 to form a thicker resin, and the surface of the resin material 4a is pressed with a flat upper metal mold 34. The resin material 4a is cured by heating to form a surface resin layer 4. Suppose the thickness of the spacer jig 31 is A and the thickness of the spacer jig 33 is B, (B-A) will be the thickness of the surface resin layer 4.

Further, in FIG. 3(i), the substrate 2, the encapsulating resin section 3 above, and the surface resin layer 4 further above are cut and divided by dicing in accordance with the wiring pattern into a predetermined size of an individual light emitting apparatus 1. Accordingly, an individual light emitting apparatus 1, which is diced into a chip form, is formed as shown in FIG. 3(j).

Therefore, the method for manufacturing the light emitting apparatus 1 according to the present invention includes: an encapsulating resin section forming step and a surface resin layer forming step, The encapsulating resin section forming step forms an encapsulating resin section 3 on the substrate 2 in such a manner to cover above the LED chip 6, by applying an encapsulating resin material 3a added with a phosphor on a surface of the substrate 2 equipped with the LED chip 6 which functions as a light emitting device, planarizing the surface, and curing the encapsulating resin material 3a. The surface resin layer forming step forms the surface resin layer 4 of a preferred color, which is different from the color of the encapsulating resin section 3, on the surface of the encapsulating resin section 3, by applying the resin material 4a added with an optical diffusion material for the surface of the cured encapsulating resin section 3, planarizing the surface by pressing, and curing the resin material 4a.

The light emitting apparatus 1 according to Embodiment 1 manufactured in this manner can be used as a flash light section for camera lighting in various electronic devices, such as a cell phone device equipped with a camera.

Figure 4:
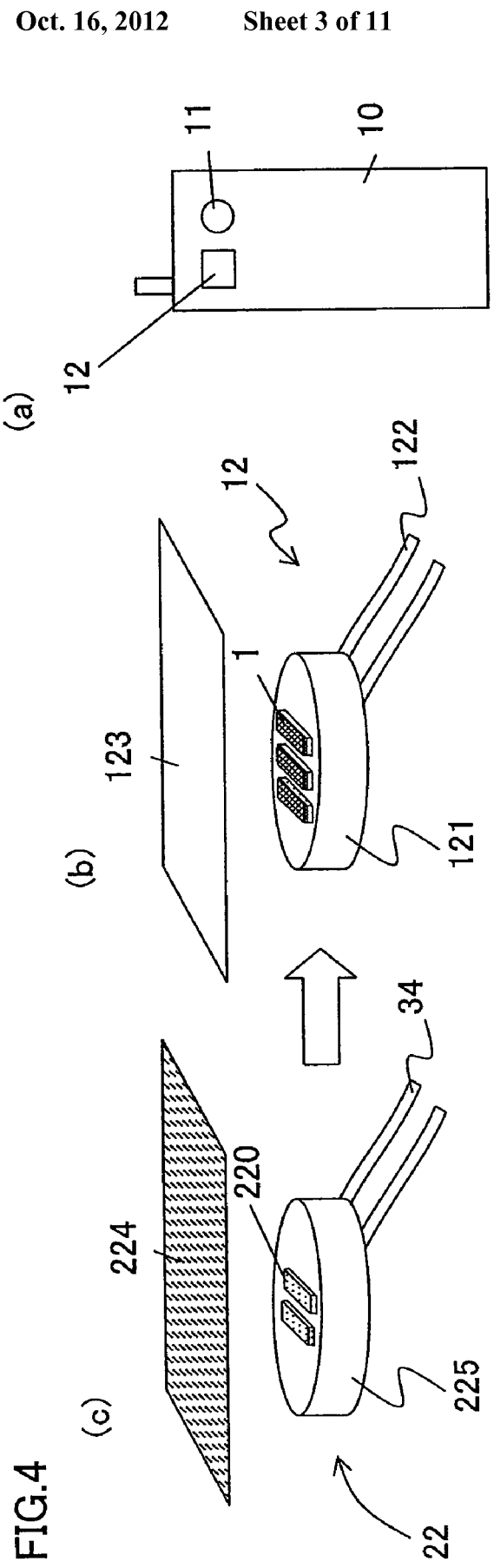
FIG. 4(a) is an elevation view showing an exemplary essential structure of a cell phone device equipped with the light emitting apparatus of FIG. 1 as a flash light section for camera lighting.
FIG. 4(b) is a perspective view showing an exemplary essential structure of the flash light section for camera lighting.
FIG. 4(c) is a perspective view showing an exemplary essential structure of a flash light section for camera lighting of a cell phone device equipped with a conventional light emitting apparatus in FIG. 8.

FIG. 4(a) is an elevation view showing an exemplary essential structure of a cell phone device equipped with the light emitting apparatus 1 in FIG. 1 as a flash light section for camera lighting. FIG. 4(b) is a perspective view showing an exemplary essential structure of the flash light section for camera lighting. FIG. 4(c) is a perspective view showing an exemplary essential structure of a flash light section for camera lighting of a cell phone device equipped with the conventional light emitting apparatus in FIG. 8.

As shown in FIG. 4(a), the cell phone device 10 according to Embodiment 1 is equipped with a camera, and a flash light section 12 for camera lighting is provided adjacent to a camera lens portion 11.

As shown in FIG. 4(b) with respect to the flash light section 12 for camera lighting, a light emitting apparatus 1 is equipped on an LED-mounted substrate 121 (which is often made of ceramic) with a good heat radiation, and anode and cathode wirings 122 are provided. A transparent cover 123 is provided on the surface side of the flash light section 12 for camera lighting equipped with the light emitting apparatus 1, so that the surface of the light emitting apparatus 1 can be seen from outside. The side surfaces which the encapsulating resin section 3 is exposed is hardly seen from the outside because the thickness of the light emitting apparatus 1 is thin, and therefore the flash light section 12 for camera lighting that is equipped with the light emitting apparatus 1 looks white through the transparent cover 123 due to the surface resin layer 4.

In a case where the transparent cover 123 is provided for the surface side of the flash light section 12 for camera lighting, some portion of light is reflected by the transparent cover 123 and the phosphor is excited by the light reentering the encapsulating resin section 3, so that the color of light changes to the color close to that of the phosphor rather than that of the LED that originally radiates. According to the light emitting apparatus 1 of Embodiment 1, the light that is reflected by the transparent cover 123 and comes back to the LED chip 6 is scattered by the optical diffusion material of the surface resin layer 4 to prevent the excitation of the phosphor, thereby avoiding the problem of color drift. Further, according to Embodiment 1, the visible light is reflected/scattered by the surface resin layer 4, so that it is difficult for the light from outside to enter the encapsulating resin section 3 when the light emitting apparatus 1 is on. Therefore, the phosphor is rarely excited by light such as the outside light, and not light from the LED chip 6, providing a secondary effect that the color and luminance do not easily drift from their predetermined values.

Figure 8:
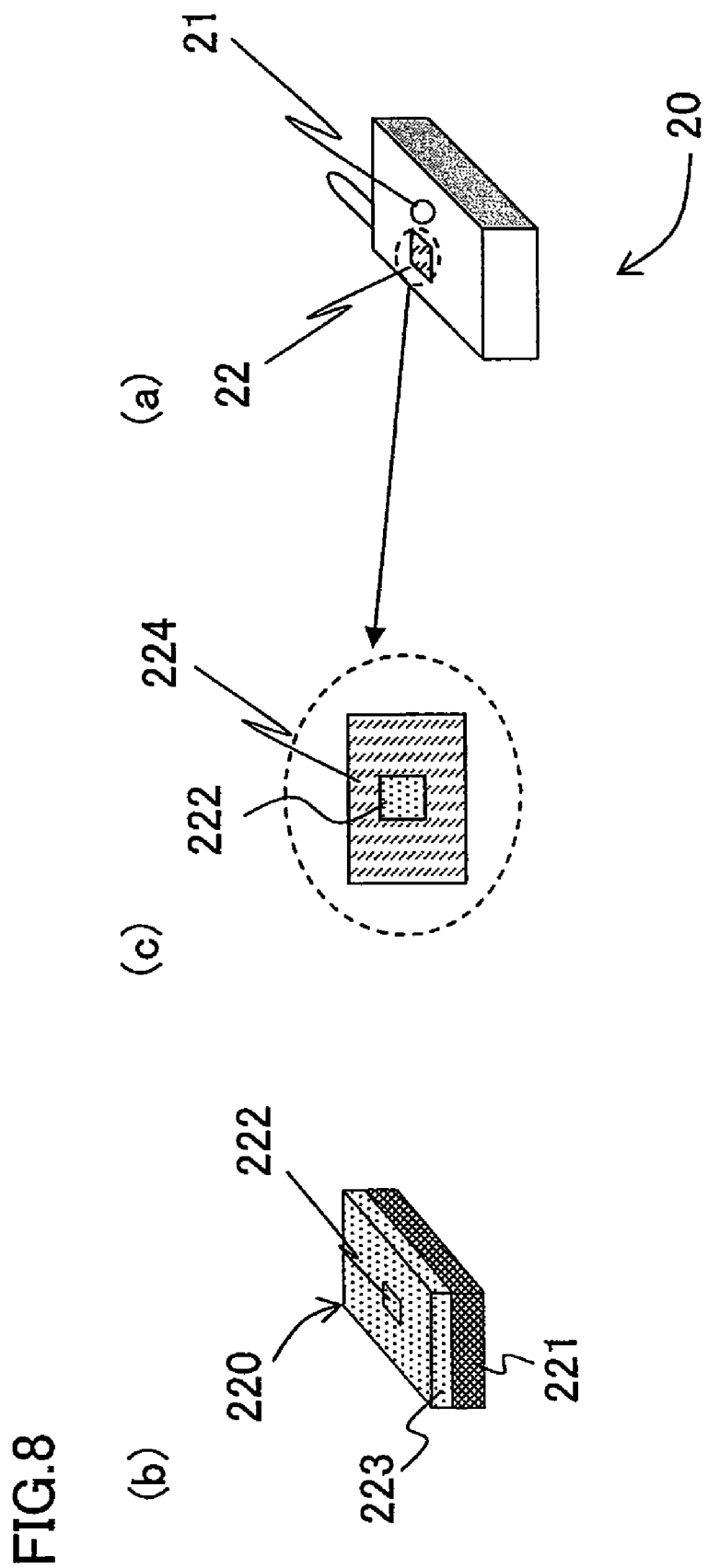
FIG. 8(a) is a perspective view showing an exemplary diagrammatic structure of a conventional cell phone device.
FIG. 8(b) is a perspective view showing an exemplary essential structure of a light emitting apparatus equipped in the flash light section in FIG. 8(a).
FIG. 8(c) is an elevation view of the flash light section in FIG. 8(a).

For the purpose of comparison, FIG. 4(c) shows an exemplary essential structure of the flash light section 22 in the cell phone device 20 equipped with the conventional light emitting apparatus 220 shown in FIG. 8 for camera lighting.

The conventional light emitting apparatus 220 is not provided with a surface resin layer, and therefore the flash light section 22 for camera lighting looks yellow when the light emitting apparatus is not on because the phosphor of the encapsulating resin section 223 is excited by the surrounding light. In order to avoid this, a frosted-glass-like semitransparent cover 224 is provided for the surface side of the flash light section 22 so as to make the yellow coloring look whitish. However, the frosted-glass-like semitransparent cover 224 decreases the emission of light from the LED.

(Variation of Embodiment 1)

In Embodiment 1 described above, a case is described where the LED chip 6 is provided on the substrate 2. In this variation, a case will be described where the LED chip 6 is provided inside a recess section of a resin package instead of the substrate 2.

Figure 5:
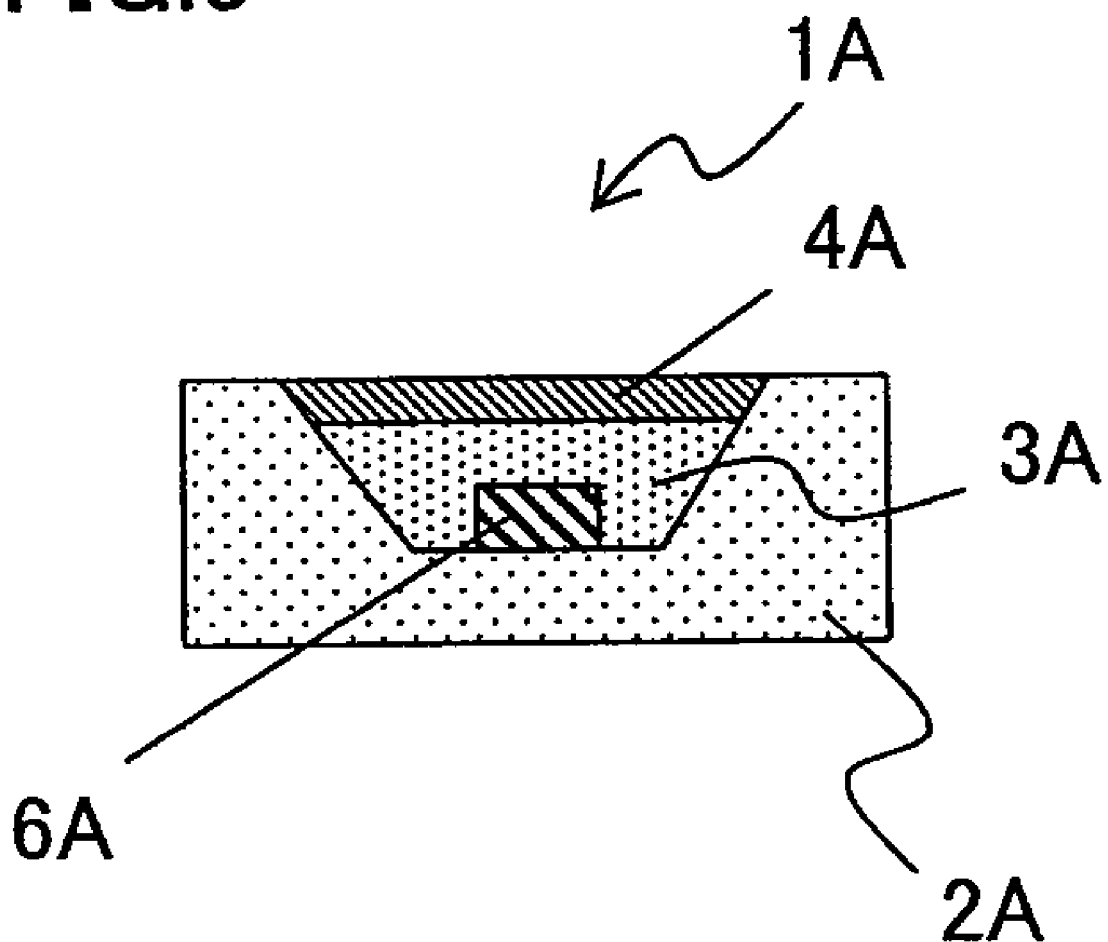
FIG. 5 is a longitudinal cross sectional view showing an exemplary essential structure of a variation of the light emitting apparatus in FIG. 1.

FIG. 5 is a longitudinal cross sectional view showing an exemplary essential structure of a light emitting apparatus according to the variation.

According to the light emitting apparatus 1A of the variation as shown in FIG. 5, an LED chip 6A is provided at the center of the bottom portion in the recess section of a resin package 2A, and the surface side of the recess of the resin package 2A is resin-encapsulated in such a manner to cover the LED chip 6A. An encapsulating resin section 3A, which is resin-encapsulated, is added with a phosphor, and a surface resin layer 4A is provided on the surface of the encapsulating resin section 3A similar to Embodiment 1 described above.

The surface side of the recess section of the resin package 2A, on which the LED chip 6A is provided, is a reflection face. In the variation, the silicon resin that constitutes the resin package 2A is added with titanium oxide as an optical diffusion material so as to form a whitened silicon resin. When the light emitting apparatus 1A is viewed from the front, the reflection face of the recess section surface of the resin package 2A, the encapsulating resin section 3A above and the surface resin layer 4A look white when the light emitting apparatus is not on.

(Embodiment 2)

In Embodiment 2, a case will be described where a surface resin layer added with at least one of an R (red color) phosphor, a G (green color) phosphor and a B (blue color) phosphor is formed on a surface of an encapsulating resin section 3 so as to make the surface of the light emitting apparatus 1 look white, a visible light color ranging from green to red, or a whitish visible light color ranging from green to red.

Figure 6:
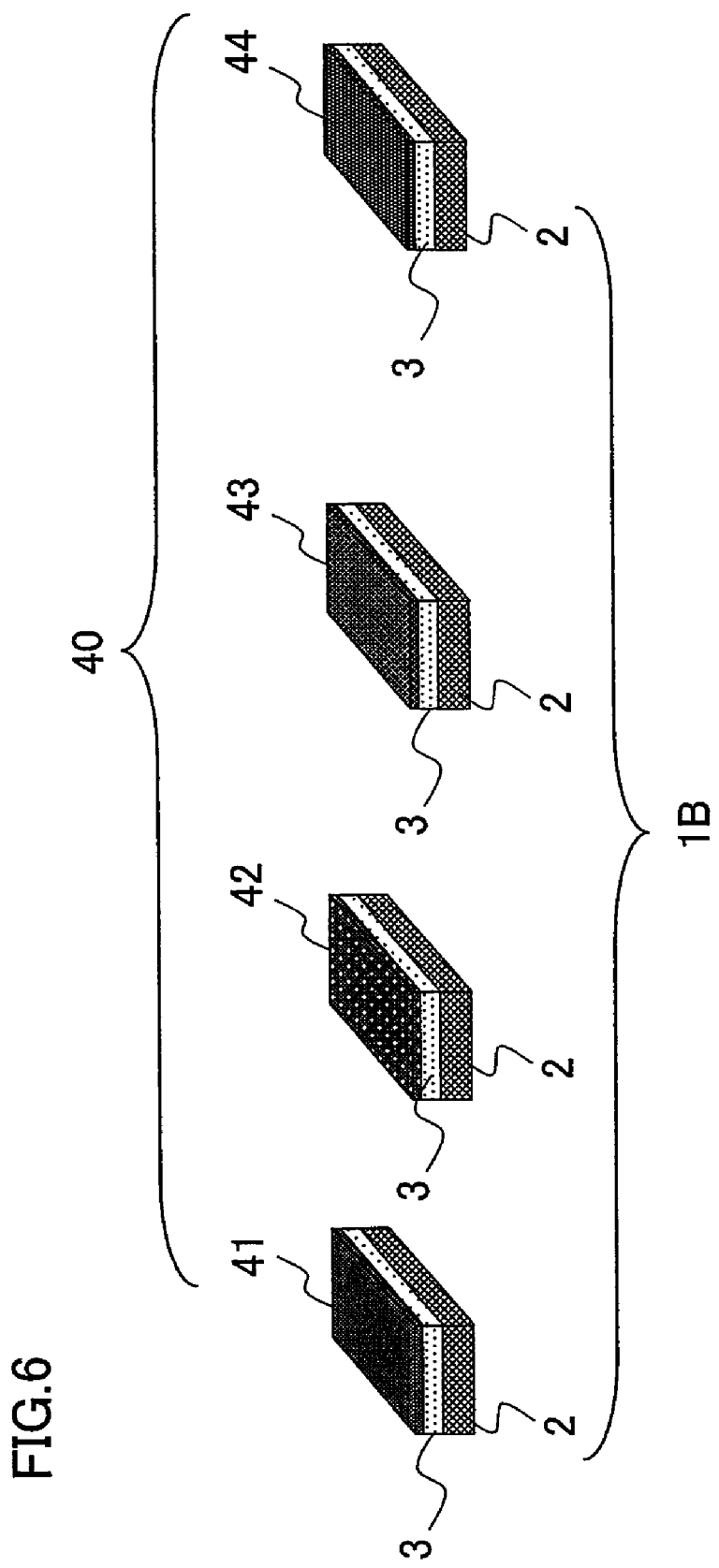
FIG. 6 is a perspective view showing exemplary essential structures of the light emitting apparatus according to Embodiment 2 of the present invention.

FIG. 6 is a perspective view showing an exemplary essential structure of a light emitting apparatus 1B according to Embodiment 2 of the present invention. The cross sectional structure in this case is the same as that of Embodiment 1 described above that is shown in FIG. 2, and therefore its illustration will be omitted. Further, the same reference numerals are provided for those structural members which have the same functional effects as those in FIG. 1.

As shown in FIG. 6, the light emitting apparatus 1B according to Embodiment 2 is equipped with a blue color LED chip 6 functioning as a light emitting device on a substrate 2. The whole surface of the substrate 2 is encapsulated by an encapsulating resin section 3 in such a manner to cover the LED chip 6. The encapsulating resin section 3 is added with a phosphor which performs a wavelength conversion on a light from the blue color LED chip 6 and radiates fluorescence. Instead of the surface resin layer 4 of Embodiment 1, a surface resin layer 40 of Embodiment 2 is provided on the surface of the encapsulating resin section 3. A red phosphor, a green phosphor and a blue phosphor are combined as appropriate and added in the surface resin layer 40 in order to obtain a preferred color.

More specifically, the R phosphor is added to the surface resin layer 40 to form a surface resin layer 41 when the appearance color of red is desired; the G phosphor is added to the surface resin layer 40 to form a surface resin layer 42 when the appearance color of green is desired; the B phosphor is added to the surface resin layer 40 to form a surface resin layer 43 when the appearance color of white is desired (the appearance color is white in a case where only a blue color phosphor is added because a blue color phosphor is not excited in the visible light); and the B phosphor is added to the surface resin layer 40 to form a surface resin layer 44 when the appearance color is desired to be whitish. Herein, the B phosphor is hardly ever excited in the surrounding light (the visible light), and therefore the appearance color looks whitish by the color of the B phosphor itself. Therefore, the surface does not have a color in the range from the blue color to the green color; however, the surface can have a color in the range from the green color to the red color by adjusting the ratio of combination of the R phosphor and the G phosphor. For example, a bright yellow will appear when the weight percentage of the phosphors in the surface resin layer 40 is set as R:G=1:5, and an orange color will appear when the ratio of the R is increased a little more. By adding the B phosphor to this, the color in the range from the green color to the red color will turn into a whitish tone of the color.

However, it is necessary to adjust the thickness of the surface resin layer 40 and the concentrations and ratio of combination of the R, G and B phosphors so as to obtain a desired luminance and chromaticity because the emission of wavelength components, which is in the region of the excitation wavelength of the phosphor added to the surface resin layer 40, is absorbed when the light emitting apparatus 1B of Embodiment 2 is lighted.

FIG. 7 is a diagram graphically showing an excitation wavelength characteristic of each colored phosphor. Note that, in FIG. 7, the longitudinal axis indicates a wavelength while the horizontal axis indicates an optical intensity. In addition, the dotted line of the graph indicates an excitation efficiency while the solid line indicates an output intensity.

As shown in FIG. 7(a), a CSMS phosphor $(Ca_3(Sc.Mg)_2 Si_3O_{12}$: cerium(Ce)-activated silicate phosphor), which is a G phosphor, has not gentle but significant change in excitation efficiency. If such a phosphor is added, the color of the surface resin layer 40 is subject to the wavelength of the surrounding light. Therefore, it is desirable to use a phosphor with a minimal dependence on the excitation efficiency for the wavelength. Specifically, β-sialon (europium-activated oxynitride phosphor $(Si.Al)_6(O.N)_8$:Eu), which is a G phosphor shown in FIG. 7(b); BOSE phosphor (europium-activated silicate phosphor $(Ba.Sr)_2SiO_4$:Eu, the ratio of Sr is more), which is shown in FIG. 7(c); CASN phosphor (nitride phosphor $(Ca.Eu)AlSiN_3$), which is shown in FIG. 7(d), and the like can be listed as a phosphor with a minimal dependence on the excitation efficiency for the wavelength.

Figure 3:
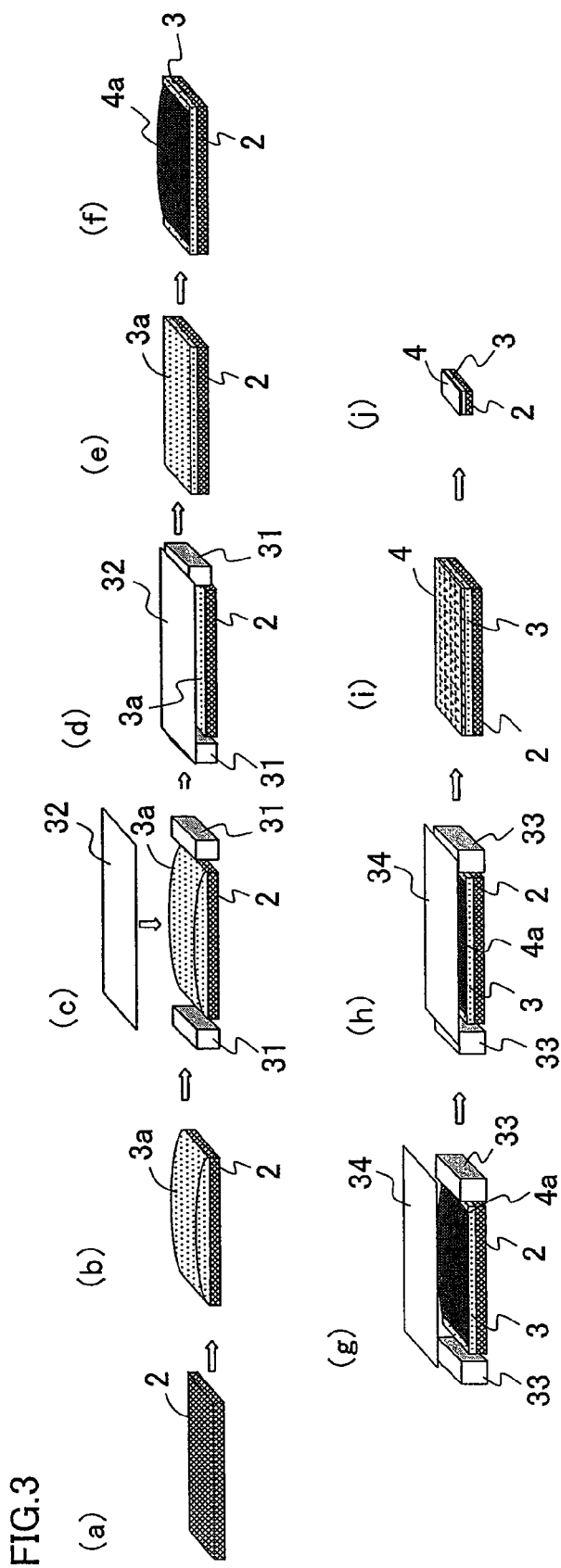
FIGS. 3(a) to 3(j) are perspective views each describing a manufacturing step of the light emitting apparatus in FIG. 1.

The light emitting apparatus 1B according to Embodiment 2 can be manufactured by the manufacturing steps explained in FIG. 3 by changing the optical diffusion material added to the surface resin layer 40 to a phosphor, which is similar to the case for the light emitting apparatus 1 according to Embodiment 1 described above.

That is, the method for manufacturing the light emitting apparatus 1B according to Embodiment 2 includes: an encapsulating resin section forming step of applying an encapsulating resin material 3a added with a phosphor on an entire surface of the substrate 2 equipped with the LED chip 6, which functions as a light emitting device, planarizing the surface by pressing, and curing the encapsulating resin material 3a so as to form an encapsulating resin section 3 on the surface of the substrate 2 in such a manner to cover above the LED chip 6; and a surface resin layer forming step of applying the resin material 4a added with at least one of a red color phosphor, a green color phosphor and a blue color phosphor for the surface of the cured encapsulating resin section 3, planarizing the surface by pressing, and curing the resin material 4a so as to form the surface resin layer 40 of a preferred color, which is different from the color of the encapsulating resin section 3, on the surface of the encapsulating resin section 3.

Further, it is feasible to apply the surface resin layer 40 added with the phosphor according to Embodiment 2 for the light emitting apparatus 1A that uses the resin package 2A described in the variation of Embodiment 1 described above.

(Variation of Embodiment 2)

Although a case where the LED chip 6 is mounted on the substrate 2 is shown in Embodiment 2 described above, a case where the LED chip 6 is mounted in a recess section of a resin package instead of the substrate 2 will be described in this variation.

Similar to the case in FIG. 5, according to the light emitting apparatus of the variation, an LED chip 6A is provided at the center of the bottom portion in the recess section of a resin package 2A, and the surface side of the recess of the resin package 2A is resin-encapsulated in such a manner to cover the LED chip 6A. An encapsulating resin section 3A, which is resin-encapsulated, is added with a phosphor, and a surface resin layer, to which at least one of an R (red) phosphor, a G (green) phosphor and a B (blue) phosphor is added, is provided on the surface of the encapsulating resin section 3A similar to Embodiment 2 described above. As a result, similar to Embodiment 2, the surface of the light emitting apparatus according to the variation appears to be of a white color, a visible light color ranging between green and red, or whitish visible light color ranging between green and red.

(Embodiment 3)

In Embodiment 3, a phosphor, which is colored in a chromatic color (e.g., red and yellow), with specific gravity greater than that of a resin material, which includes an optical diffusion material (or an optical diffusion agent) and a phosphor, for an encapsulating resin section is selected. Further, a phosphor with greater specific gravity than that of an optical diffusion material is selected herein. Thus, the selected phosphor and optical diffusion material are included in a resin material, so that a light emitting apparatus is covered with the resin material and the resin material is cured (heat cured). Due to the decrease of resin viscosity caused during the heat curing of the resin material and the difference of specific gravities among the resin material in the encapsulating resin section, the optical diffusion material and the phosphor, the phosphor with the greatest specific gravity precipitates on the light emitting apparatus side. On the other hand, the optical diffusion material is dispersed in the resin material, or it is distributed on the surface side opposite to the light emitting apparatus due to the specific gravity. Therefore, the optical diffusion material is dispersed in a resin material concentrating on the surface side of light emitting view plane (light emitting apparatus mounting side), thereby diminishing an yellow color of a phosphor by the optical diffusion material.

As described above, the encapsulating resin section is divided into a layer substantially including a phosphor and a layer substantially including an optical diffusion agent from the side closer to the light emitting apparatus in a thickness direction. Alternatively, the encapsulating resin section is divided into a layer substantially including a phosphor, an intermediate layer including the phosphor and an optical diffusion material intermingled together and a layer substantially including the optical diffusion material. With such an appearance with a structure of two or three layers or more, the color of the phosphor itself (e.g., yellow) can be diminished and hidden by the layer above that includes the optical diffusion material.

As the optical diffusion material, silicon dioxide (specific gravity: 2.2), calcium carbonate (specific gravity: 2.93), titanium oxide (specific gravity: 4.26), zinc oxide (specific gravity: 5.8), aluminum oxide (specific gravity: 3.9), barium titanate (specific gravity: 5.5), barium sulfate (specific gravity: 4.3), magnesium hydroxide (specific gravity: 2.4), calcium hydroxide (specific gravity: 2.2), magnesium oxide (specific gravity: 3.6) can be listed specifically, and any one of them or the combination thereof can be used.

On the other hand, it is desirable for a material for the encapsulating resin section as a translucent mold material to have a good light resistance against light from a light emitting device and a phosphor as well as to have good translucency and weather resistance. Specifically, solventless liquid translucent thermosetting resin or solvent liquid translucent thermosetting resin, such as epoxy resin (specific gravity: 1.2), silicone resin (specific gravity: 1.0), urethane resin (specific gravity: 1.2), unsaturated polyester resin (specific gravity: 1.2), acrylic urethane resin (specific gravity: 1.2), and polyimide resin (specific gravity: 1.3) can be preferably listed as a material for a translucent mold material. Similarly, solvent liquid translucent thermoplastic resin, such as acrylic resin (specific gravity: 1.2), polycarbonate resin (specific gravity: 1.2), and polynorbornene resin (specific gravity: 1.1) can be used.

Hereinafter, Examples 1 to 3 will be described in detail, where Embodiment 3 is specifically explained.

EXAMPLE 1

Figure 9:
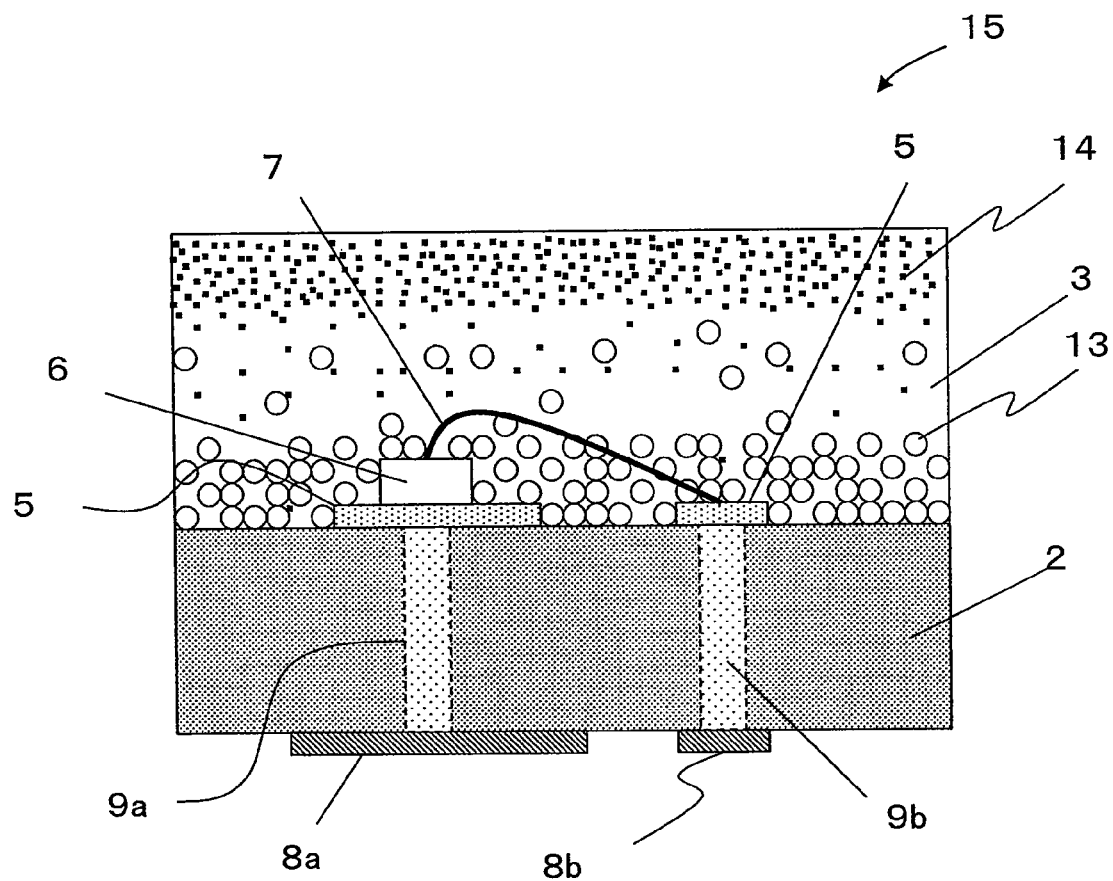
FIG. 9 is a longitudinal cross sectional view showing an exemplary essential structure of a light emitting apparatus according to Example 1 of Embodiment 3 of the present invention.

FIG. 9 is a longitudinal cross sectional view showing a light emitting apparatus according to Example 1 of Embodiment 3 of the present invention. Further, the same reference numerals are provided for those structural members which have the same functional effects as those in FIG. 2.

In FIG. 9, a light emitting apparatus 15 according to Example 1 has an encapsulating resin section 3, the encapsulating resin section being divided into a layer substantially including a phosphor 13 and a layer substantially including an optical diffusion material 14 as a surface resin layer from the side closer to an LED chip 6 as a light emitting device. Alternatively, the encapsulating resin section is divided into a layer substantially including the phosphor 13, an intermediate layer including the phosphor 13 and an optical diffusion material 14 intermingled together, and a layer substantially including the optical diffusion material 14 as the surface resin layer from the side closer to the light emitting device.

According to a manufacturing method of the light emitting apparatus 15 of Example 1 with the structure described above, an optical diffusion agent 14, such as silicon dioxide (specific gravity: 2.2), and a yellow phosphor 13 with a high light emitting efficiency, such as BOSE (europium activated silicate phosphor, $(Ba.Sr)_2SiO_4:Eu$) (specific gravity: 5.0), both of which are used as a translucent mold material, are included and stirred in a silicone resin (specific gravity: 1.0) of an encapsulating resin section 3. At this time, the viscosity of the silicone resin is 0.7 Pa·s. With such a state, the phosphor 13 and the optical diffusion agent 14 are mixed so as to be dispersed almost evenly in the encapsulating resin section 3, which will be a translucent mold material.

Next, the mixture is cured for the first time at 110 degrees Celsius for 60 minutes and cured for the second time at 150 degrees Celsius for 300 minutes so as to form a light emitting apparatus 15. When the formed light emitting apparatus 15 is viewed from the light emitting view plane side, the light emitting view plane is milk white, and the light emitting apparatus 15 has a good outward appearance having a milk white color or a white color without appearing to be yellow even if light from the outside is radiated.

With the structure described above, the manufacturing method of the light emitting apparatus 15 of Example 1 includes the steps of mixing the optical diffusion material 14 and the phosphor 13, the phosphor 13 having greater specific gravity than the optical diffusion material 14, in the resin material that is used for the encapsulating resin section 3 in such a manner to disperse the optical diffusion material and the phosphor almost evenly; and precipitating the phosphor 13 in the resin material to the LED chip 6 side by the decrease of resin viscosity caused at the heat curing of the resin material and by the difference of specific gravities between the optical diffusion material 14 and the phosphor 13 so as to distribute the optical diffusion material at the surface side of the resin material, which is opposite from the LED chip 6 side.

In addition, an analysis result for the formed light emitting apparatus 15 indicates as shown in the cross sectional view of FIG. 9 that the concentration of the phosphor 13 increases as it gets closer to the LED chip 6, which functions as a light emitting device inside a cavity, while the optical diffusion agent 14 gradually increases towards the surface side opposite from the LED chip 6.

EXAMPLE 2

Figure 10:
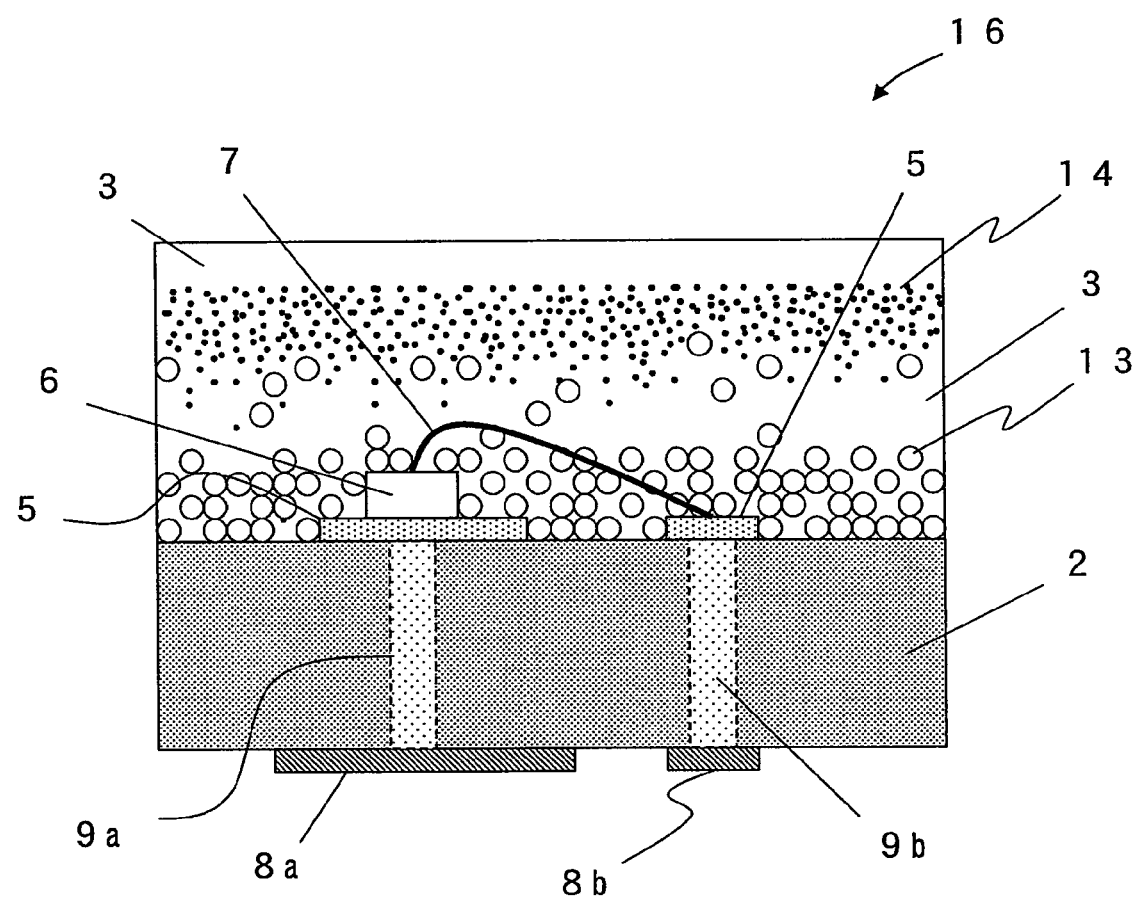
FIG. 10 is a longitudinal cross sectional view showing an exemplary essential structure according to a light emitting apparatus of Example 2 of Embodiment 3 of the present invention.

FIG. 10 is a longitudinal cross sectional view showing an exemplary essential structure according to a light emitting apparatus 16 of Example 2 of Embodiment 3 according to the present invention. Further, the same reference numerals are provided for those structural members which have the same functional effects as those in FIG. 2.

In FIG. 10, the light emitting apparatus 16 according to Example 2 has an encapsulating resin section 3, the encapsulating resin section being divided, from the side closer to the light emitting device, into a layer substantially including a phosphor 13, a layer including the phosphor 13 and an optical diffusion material 14 intermingled together, a layer substantially including the optical diffusion material 14, and a layer only with the resin material for the encapsulating resin section 3 (a layer which does not include the phosphor 13 or the optical diffusion material 14).

With the structure described above, the manufacturing method of the light emitting apparatus 16 of Example 2 first includes the step of mixing the optical diffusion material 14, such as calcium hydroxide (specific gravity: 2.2) and the yellow phosphor 13 with a high light emitting efficiency, such as $(Ba.Sr)_2SiO_4:Eu$ (specific gravity: 5.0), both of which are used as a translucent mold material, are included and stirred in a silicone resin (specific gravity: 1.0) of the encapsulating resin section 3. At this time, the viscosity of the silicone resin is 0.7 Pa·s. With such a state, the phosphor 13 and the optical diffusion agent 14 are mixed so as to be dispersed almost evenly in the encapsulating resin section 3, which will be a translucent mold material.

Then, the mixture is cured for the first time at 80 degrees Celsius for 60 minutes and cured for the second time at 150 degrees Celsius for 120 minutes so as to form the light emitting apparatus 16. When the formed light emitting apparatus 16 is viewed from the light emitting view plane side, the light emitting view plane is milk white, and the light emitting apparatus 16 has a good outward appearance having a milk white color or a white color without appearing to be yellow even if light from the outside is radiated.

In addition, an analysis result for the formed light emitting apparatus 16 indicates as shown in the cross sectional view of FIG. 10 that the concentration of the phosphor 13 increases as it gets closer to the LED chip 6, while the optical diffusion agent 14 gradually increases towards the surface side opposite from the LED chip 6. Further, a layer of the encapsulating resin section 3 composed only of a translucent mold material is formed on the top-most side.

As a result, the light emitting apparatus 16 has the encapsulating resin section 3 that is divided from the side closer to the light emitting device 6 into a layer substantially including the phosphor 13, an intermediate layer including the phosphor 13 and the optical diffusion agent 14 intermingled together, and a layer substantially including the optical diffusion agent 14. Alternatively, the light emitting apparatus 16 of Embodiment 4 has a translucent mold section that is divided, from the side closer to the light emitting device 6, into a layer substantially including the phosphor 13, an intermediate layer including the phosphor 13 and the optical diffusion agent 14 intermingled together, a layer substantially including the optical diffusion agent 14 and a layer only with the encapsulating resin section 3 thereon.

With the structure described above, the manufacturing method of the light emitting apparatus 16 of Example 2 includes the steps of mixing the optical diffusion material 14 and the phosphor 13, the phosphor 13 having greater specific gravity than the optical diffusion material 14, in the resin material that is used for the encapsulating resin section 3 in such a manner to disperse the optical diffusion material and the phosphor almost evenly; and precipitating the phosphor 13 in the resin material to the LED chip 6 side due to the decrease of resin viscosity caused during the heat curing of the resin material and by the difference of specific gravities between the optical diffusion material 14 and the phosphor 13 so as to distribute the optical diffusion material at the surface side of the resin material, which is opposite from the LED chip 6 side.

In addition, the optical diffusion agent 14 can be included in the layer that mainly includes the phosphor 13, and the phosphor 13 can be included in the layer that mainly includes the optical diffusion agent 14. The optical diffusion agent 14 can be included in the layer only with the encapsulating resin layer 3. A small amount of optical diffusion agent 14 can be intermingled in the layer only with the phosphor 13, while a small amount of the phosphor 13 can be intermingled in the layer only with the optical diffusion agent 14. Even if the phosphor and the optical diffusion agent are intermingled together, such a configuration will not deviate from the technical effect according to the present application.

Although the word "layer" is used herein, the configuration described above does not have to be clearly divided into layers or the borders between layers do not have to be clear. Even if the layers are not clearly divided from each other, the technical effect according to the present application can be sufficiently obtained.

Herein, the encapsulating resin 3 is made of the same material as the translucent mold material; however, a different material can also be used.

EXAMPLE 3

Figure 11:
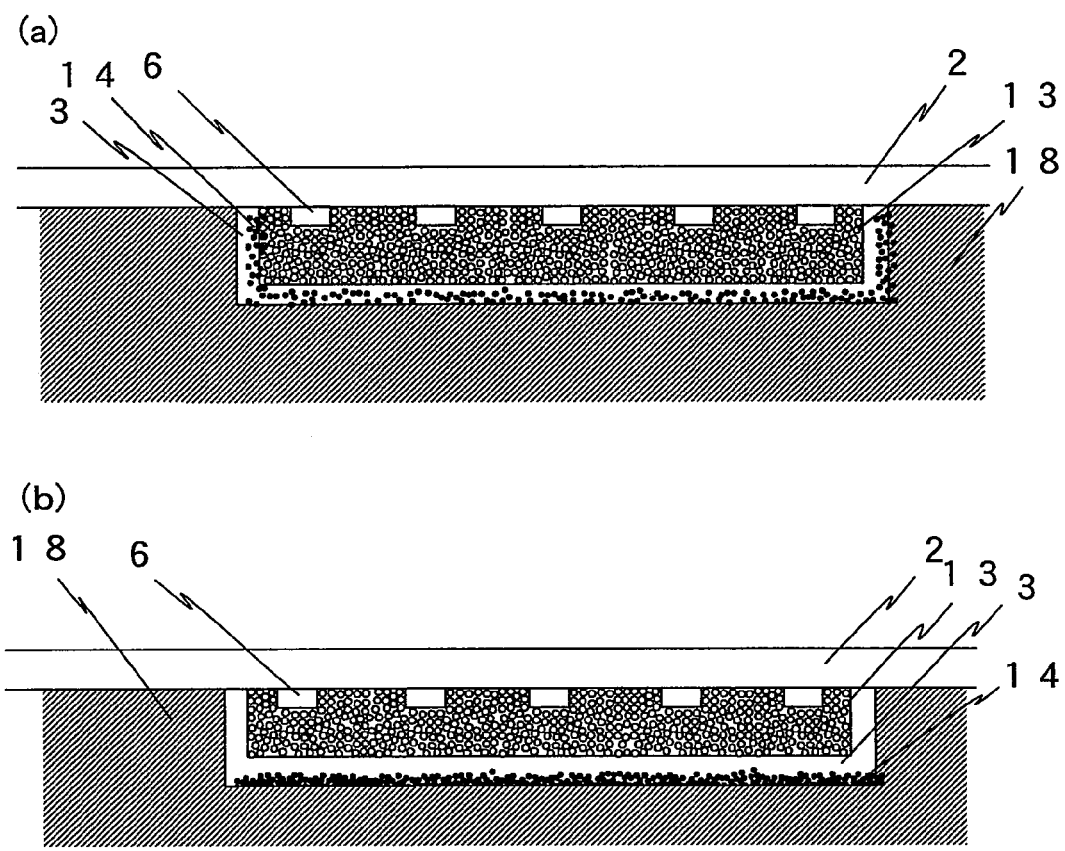
FIG. 11(a) and FIG. 11(b) are longitudinal cross sectional views each showing an exemplary essential structure in the middle of the manufacturing step of the light emitting apparatus according to Example 3 of Embodiment 3 of the present invention.
Figure 12:
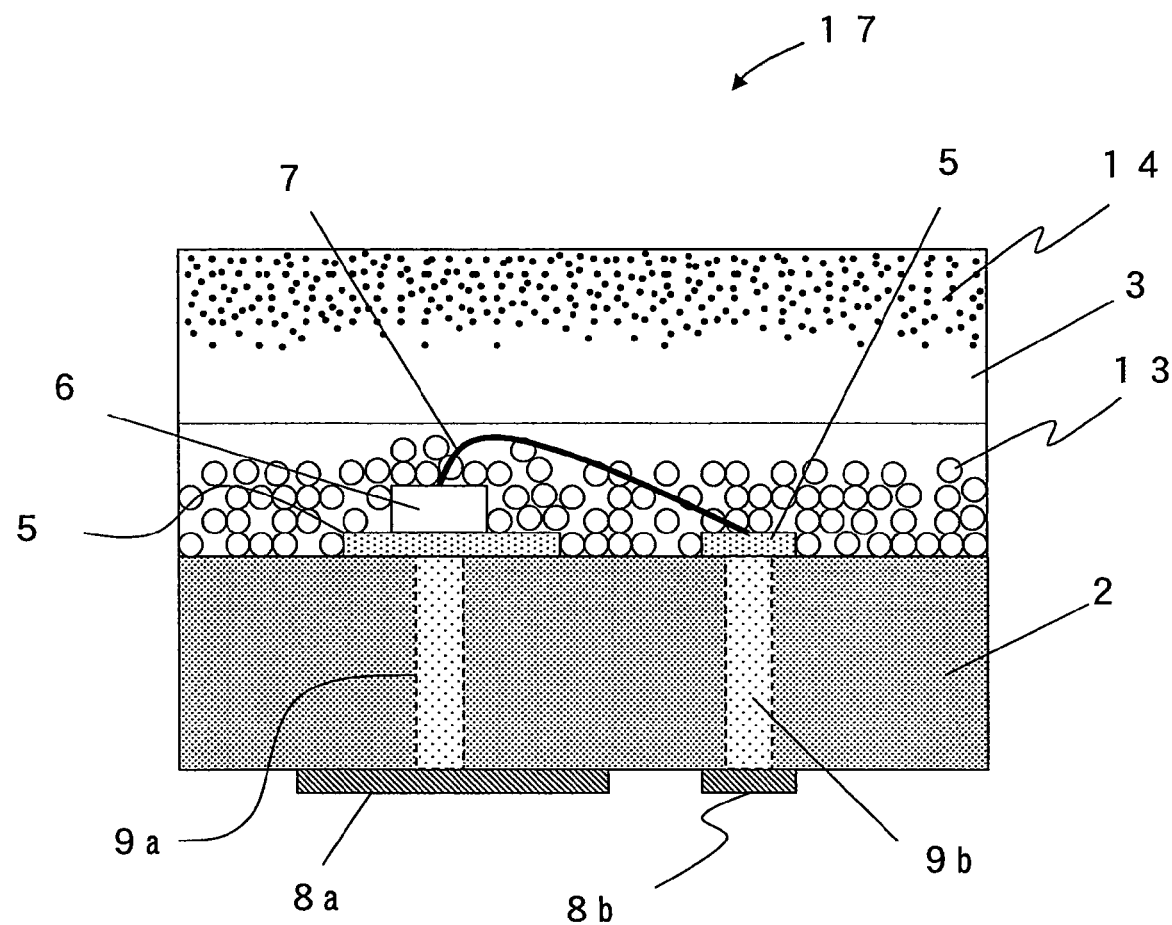
FIG. 12 is a longitudinal cross sectional view showing an exemplary essential structure of the light emitting apparatus according to Example 3 of Embodiment 3 of the present invention.

FIGS. 11(a) and 11(b) are respectively longitudinal cross sectional views each showing an exemplary structure in the middle of the manufacturing step of the light emitting apparatus according to Example 3 of the present invention. FIG. 12 is a longitudinal cross sectional view showing an exemplary essential structure of the light emitting apparatus according to Example 3 of the present invention. Further, the same reference numerals are provided for those structural members which have the same functional effects as those in FIG. 2.

As shown in FIG. 12, a light emitting apparatus 17 of Example 3 has an encapsulating resin section 3 which is divided from the side closer to a light emitting device 6 into a layer substantially including a phosphor 13, and a layer substantially including the optical diffusion material 14, which functions as a surface resin layer.

According to the manufacturing method of the light emitting apparatus 17 of Example 3 with the structure described above, as shown in FIG. 11(a), the encapsulating resin 3, which is a silicone resin added with $(Ba.Sr)_2SiO_4$: Eu (specific gravity: 5.0), as the yellow phosphor 13 with a high light emitting efficiency is first applied on the surface of a substrate 2 on which the LED chip 6 as a light emitting device is mounted, the surface is planarized by pressing, and the encapsulating resin 3 are heated and cured so as to form the encapsulating resin 3 in which the phosphor 13 is added on the surface of the substrate 2 in such a manner to cover the LED chip 6.

Next, the encapsulating resin 3, which is a silicone encapsulating resin added with silicon dioxide (specific gravity: 2.2) of the optical diffusion material 14, is poured into a recess section of a metal mold 18. An LED chip 6 covered with the encapsulating resin 3 added with the phosphor 13 is inserted into the recess section of the metal mold 18 into which the encapsulating resin 3 added with the optical diffusion material 14 is poured. Then, the encapsulating resin 3 added with the optical diffusion material 14 is cured by heating. During the heat curing of the encapsulating resin 3 added with the optical diffusion material 14, the optical diffusion material 14 precipitates due to the decrease of resin viscosity and the difference of specific gravities.

For this reason, the encapsulating resin 3 added with the cured optical diffusion material 14 is formed on the encapsulating resin 3 added with the phosphor 13. As shown in FIG. 11(b), the optical diffusion material 14 is formed by precipitating near the top-most surface of the encapsulating resin 3 added with the optical diffusion material 14 opposite from the side where the LED chip 6 is mounted.

As described above, the manufacturing method of the light emitting apparatus 17 of Example 3 includes the steps of pouring a resin material added with the optical diffusion material 14 into the metal mold 18 having a cavity (recess section); inserting the mounting side of the LED chip 6 into the resin material added with the optical diffusion material 14 with the mounting side of the LED chip 6 covered with the encapsulating resin section 3 added with the phosphor facing down; and precipitating the optical diffusion material 14 due to the decrease of resin viscosity of the resin material added with the optical diffusion material 14 at the heat curing and due to the difference of specific gravities between the resin material and the optical diffusion material 14.

Further, the metal mold 18 has a cavity section (recess section), and the encapsulating resin 3 added with the phosphor 13 is inserted in the metal mold 18, into which the encapsulating resin 3 added with the optical diffusion material 14 is poured, in such a manner that the encapsulating resin 3 added with the phosphor 13 is arranged below and the substrate side 2 is arranged above. From the metal mold 18, the substrate 2, the LED chip 6, the encapsulating resin 3 added with the phosphor 13, and the encapsulating resin 3 added with the cured optical diffusion material 14 are taken out.

Further, the substrate 2, the encapsulating resin 3 thereon, and the encapsulating resin 3 (surface resin layer) added with the optical diffusion material 14 further thereon are cut and divided by dicing in accordance with wiring patterns into an individual light emitting apparatus 17.

With the structure described above, the individual light emitting apparatus 17, which is diced into a chip form, is formed. As shown in FIG. 12, according to the light emitting apparatus 17 of Example 3, the phosphor 13 is formed near the LED chip 6 and the optical diffusion material 14 is formed near the top-most surface opposite from the surface on which the LED chip 6 is mounted.

(Variation of Embodiment 3)

Although a case where the LED chip 6 is mounted on the substrate 2 is described in Embodiment 3, a case where the LED chip 6 is mounted in a recess section of a resin package instead of the substrate 2 will be descried in this variation.

Similar to the case in FIG. 5, according to the light emitting apparatus of the variation, an LED chip 6A is provided at the center of the bottom portion in the recess section of a resin package 2A, and the surface side of the recess of the resin package 2A is resin-encapsulated in such a manner to cover the LED chip 6A. An encapsulating resin section 3A, which is resin-encapsulated, is added with a phosphor 13, and a surface resin layer including the phosphor 13 and the optical diffusion material 14 that are separated from each other is provided on the surface of the encapsulating resin section 3A similar to Embodiment 3 described above. As a result, similar to Embodiment 3, the surface of the light emitting apparatus according to the variation appears to be of a white color.

With the structure above, and according to Embodiments 1 to 3, the surface of the substrate 2 on which the LED chip 6 is mounted is resin-encapsulated with the encapsulating resin section 3 added with a phosphor that performs a wavelength conversion on the emission from the LED chip 6; and the surface resin layer of a preferred color, which is different from the color of the encapsulating resin section 3 added with a yellow color phosphor, is further provided on the surface of the encapsulating resin section 3. A yellow color phosphor is added to the encapsulating resin section 3 to make it look yellow. An optical diffusion material is added on the surface resin layer 4 to make the surface resin layer 4 look white by the reflection of the surrounding light. Alternatively, a preferred color can be obtained in response to the surrounding light by adding a red color phosphor, a green color phosphor and/or a blue color phosphor to the surface resin layer 40, so that the surface resin layer 40 appears to be of a white color, a visible light color ranging between green and red, or whitish visible light color ranging between green and red. In this manner, any one of the light emitting apparatus 1, 1A, 1B, and 15 to 17, in which a phosphor is added to the encapsulating resin section 3 and which is capable of emitting white light, can be used as camera lighting so as not to spoil the appearance due to the coloring of the encapsulating resin section 3.

In Embodiments 1 to 3 described above, a case is described where any one of the light emitting apparatus 1, 1A, 1B, and 15 to 17 is used as a flash light section for camera lighting that is used for a cell phone device. However, the present invention is not limited to this kind of one small light emitting apparatus, but it can also be applied for a light emitting module in which a plurality of light emitting devices and respective encapsulating resin sections 3 are provided on the same substrate and surface resin layers 4 or 40 are provided on the respective encapsulating resin sections 3. In addition, any one of the light emitting apparatus 1, 1A, 1B, and 15 to 17 can be applied not only for a cell phone device but also for a variety of electronic devices (or electronic information devices) equipped with a camera.

Examples of such electronic devices include, but are not limited to, a digital camera (e.g., a digital video camera, a digital still camera), an image input camera (e.g., a door intercom camera, a camera for television telephone and a camera for cell phone), and a cell phone device.

The electronic device according to Embodiments 1 to 3 of the present invention may use any one of the light emitting apparatus 1, 1A, 1B, and 15 to 17 of Embodiment 1 to 3 for camera lighting and may include at least one of a memory section (e.g., recording media) for data-recording a high-quality image data obtained by a image capturing section after a predetermined signal process is performed on the image data for recording; a display section (e.g., liquid crystal display device) for displaying this image data on a display screen (e.g., liquid crystal display screen) after a predetermined signal process is performed for display; a communication section (e.g., transmitting and receiving device) for communicating this image data after a predetermined signal process is performed on the image data for communication; and an image output section for printing (typing) and outputting (printing out) this image data.

As described above, the present invention is exemplified by the use of its preferred Embodiments 1 to 3. However, the present invention should not be interpreted solely based on Embodiments 1 to 3 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 3 of the present invention. Furthermore, it is understood that any patent, any patent application and any references cited in the present specification should be incorporated by reference in the present specification in the same manner as the contents are specifically described therein.

INDUSTRIAL APPLICABILITY

According to the present invention, in the field of a light emitting apparatus equipped with a light emitting device, such as an LED, and resin-encapsulated thereon; a method for manufacturing the light emitting apparatus; an electronic device equipped with the light emitting apparatus as camera lighting therein, such as a digital camera (e.g., digital video camera and digital still camera), a door intercom camera, a camera for television telephone; and a camera equipped in a cell phone; and a cell phone device with the camera equipped in a cell phone, the surface of the light emitting apparatus can present an appearance of a preferred color and improve the appearance when the light emitting apparatus is not on, by providing a surface resin layer of the preferred color different from the encapsulating resin section on the surface of the encapsulating resin section.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light emitting apparatus having a light emitting device mounted on a substrate or a resin package where a substrate surface or the resin package is resin-encapsulated by an encapsulating resin section comprising an encapsulating resin added with a first phosphor in such a manner to cover the light emitting device and configured to control a color of light output by the light emitting apparatus, wherein a thickness of the encapsulating resin section is configured to balance with a white color of the light emitting apparatus when the light emitting device is not emitting light, the encapsulating resin section is a translucent mold section, which is divided, from the side closer to the light emitting device, into a layer substantially including the first phosphor, an intermediate layer including the first phosphor, an optical diffusion material and a second phosphor and a layer substantially including the optical diffusion material and the second phosphor that is substantially precipitated to a surface side of the encapsulating resin section, such that the layer substantially including the optical diffusion material and the second phosphor has a different color from that of the layer substantially including the first phosphor, and a portion of the encapsulating resin section containing the optical diffusion material and the second phosphor is configured to cause a surface of the encapsulating resin section to appear white when the light emitting device is not emitting light.

2. A light emitting apparatus according to claim 1, wherein the light emitting device is a blue color LED.

3. A light emitting apparatus according to claim 1, wherein the first phosphor is a yellow color phosphor or a chromatic color phosphor.

4. A light emitting apparatus according to claim 1, wherein the color of the encapsulating resin added with the first phosphor is yellow.

5. A light emitting apparatus according to claim 1, wherein the optical diffusion material is capable of reflecting a visible light ranging between a blue color and a red color.

6. A light emitting apparatus according to claim 1, wherein a surface of the substrate or a surface of a recess section of the resin package, on which the light emitting device is mounted, is a reflection face.

7. A light emitting apparatus according to claim 1, wherein the substrate is an insulating substrate.

8. A light emitting apparatus according to claim 1, wherein a plurality of the light emitting devices and the encapsulating resin sections are provided on the substrate as light emitting modules.

9. A light emitting apparatus according to claim 1, wherein the encapsulating resin section further includes, on the side farthest from the light emitting device, a layer with only the encapsulating resin.

10. A light emitting apparatus according to claim 1, wherein the first and second phosphors and the optical diffusion material are selected to have specific gravities greater than the specific gravity of a resin material for an encapsulating resin section that includes the first and second phosphors and the optical diffusion material.

11. A light emitting apparatus according to claim 1, wherein the first phosphor is selected to have a specific gravity greater than the specific gravity of the optical diffusion material and the second phosphor.

12. A light emitting apparatus according to claim 1, wherein the optical diffusion material is composed of inorganic fine particles.

13. A light emitting apparatus according to claim 1, wherein a material for the encapsulating resin is any one of solventless liquid translucent thermosetting resin, solvent liquid translucent thermosetting resin, and solvent liquid translucent thermoplastic resin.

14. An electronic device equipped with a camera and the light emitting apparatus according to claim 1 as camera lighting.

15. A cell phone device equipped with a camera and the light emitting apparatus according to claim 1 as camera lighting.

16. A cell phone device according to claim 15, wherein a transparent cover is provided for a surface side of the light emitting apparatus.

* * * * *